(12) United States Patent
Fukuda

(10) Patent No.: US 8,665,636 B2
(45) Date of Patent: Mar. 4, 2014

(54) SEMICONDUCTOR STORAGE DEVICE

(75) Inventor: Toshikazu Fukuda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 224 days.

(21) Appl. No.: 13/237,269

(22) Filed: Sep. 20, 2011

(65) Prior Publication Data

US 2012/0236661 A1   Sep. 20, 2012

(30) Foreign Application Priority Data

Mar. 16, 2011   (JP) .................................. 2011-058016

(51) Int. Cl.
   *G11C 11/00*   (2006.01)
(52) U.S. Cl.
   USPC ................. 365/154; 365/189.14; 365/230.01; 365/233.1; 365/233.11; 327/144; 327/156; 711/167; 711/202
(58) Field of Classification Search
   USPC .................... 365/154, 189.14, 230.01, 233.1, 365/233.11; 327/144, 156; 711/167, 202
   See application file for complete search history.

(56) References Cited

U.S. PATENT DOCUMENTS 7,260,018 B2 *   8/2007   Nii ........................... 365/230.05
2009/0129194 A1 *   5/2009   New et al. ................ 365/230.05

FOREIGN PATENT DOCUMENTS

JP   2000-031297   1/2000

OTHER PUBLICATIONS

Nii, K., et al., "A 65 nm Ultra-High-Density Dual-port SRAM with 0.71um 8T-cell for SoC", 2006, IEEE, Symposium on VLSI Circuits Digest of Technical Papers.

* cited by examiner

*Primary Examiner* — Vu Le
*Assistant Examiner* — Han Yang
(74) *Attorney, Agent, or Firm* — White & Case LLP

(57) ABSTRACT

According to one embodiment, when a row address of a port A matches a row address of a port B, a memory cell is accessed only from the port A by controlling a word line potential of the port A based on a third clock, and data is exchanged between a bit line of the port A and the port A based on a first clock and data is exchanged between the bit line of the port A and the port B based on a second clock.

20 Claims, 7 Drawing Sheets

SEMICONDUCTOR STORAGE DEVICE

CROSS-REFERENCE TO RELATED APPLICATIONS

This application is based upon and claims the benefit of priority from the prior Japanese Patent Application No. 2011-58016, filed on Mar. 16, 2011; the entire contents of which are incorporated herein by reference.

FIELD

Embodiments described herein relate generally to a semiconductor storage device.

BACKGROUND

In dual port SRAMs, memory cells can be accessed independently from a port A and a port B. Therefore, when row addresses of the port A and the port B match, word lines are open in both ports in memory cells belonging to the row, which makes decrease in cell current and deterioration of disturb characteristics.

DETAILED DESCRIPTION

In general, according to a semiconductor storage device of an embodiment, a memory cell, a clock generating unit, an address comparator, a word line control unit, and a column selector are included. The memory cell is accessible independently from a port A and a port B. The clock generating unit generates a third clock from a first clock of the port A and a second clock of the port B. The address comparator compares a row address of the port A with a row address of the port B. The word line control unit, when the row address of the port A matches the row address of the port B, makes the memory cell to be accessed only from the port A by controlling a word line potential of the port A based on the third clock. The column selector, when the row address of the port A matches the row address of the port B, makes data to be exchanged between a bit line of the port A and the port A based on the first clock and makes data to be exchanged between the bit line of the port A and the port B based on the second clock.

A semiconductor storage device according to the embodiment will be explained below with reference to the drawings. The present invention is not limited to the embodiment.

Figure 1:
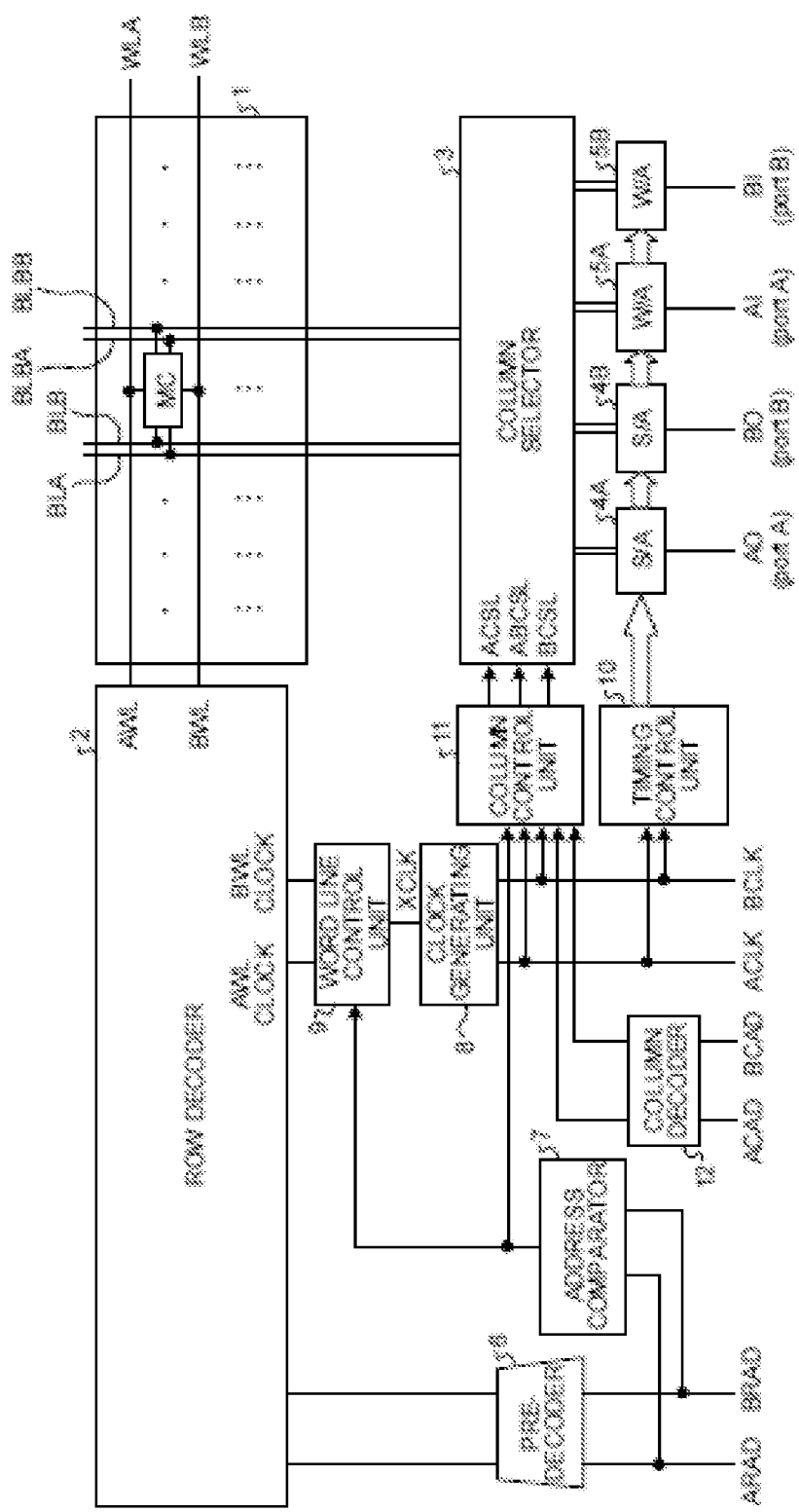
FIG. 1 is a block diagram illustrating a schematic configuration of a semiconductor storage device according to an embodiment.

FIG. 1 is a block diagram illustrating a schematic configuration of a semiconductor storage device according to an embodiment.

In FIG. 1, this semiconductor storage device includes a memory cell array 1, a row decoder 2, a column selector 3, sense amplifiers 4A and 4B, write amplifiers 5A and 5B, a pre-decoder 6, an address comparator 7, a clock generating unit 8, a word line control unit 9, a timing control unit 10, a column control unit 11, and a column decoder 12.

In the memory cell array 1, memory cells MC independently accessible from a port A and a port B are arranged in a matrix manner in a row direction and a column direction.

Figure 2:
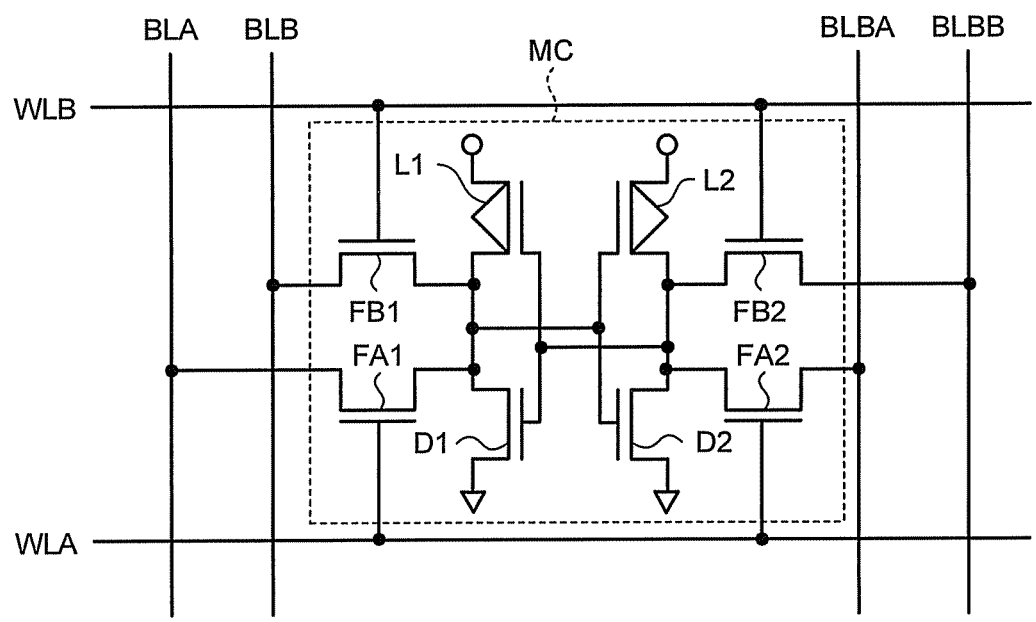
FIG. 2 is a circuit diagram illustrating a configuration example of a memory cell in FIG. 1.

FIG. 2 is a circuit diagram illustrating a configuration example of the memory cell in FIG. 1.

In FIG. 2, the memory cell MC includes a pair of drive transistors D1 and D2, a pair of load transistors L1 and L2, a pair of port-A transfer transistors FA1 and FA2, and a pair of port-B transfer transistors FB1 and FB2. P-channel field-effect transistors can be used as the load transistors L1 and L2, and N-channel field-effect transistors can be used as the drive transistors D1 and D2, the port-A transfer transistors FA1 and FA2, and the port-B transfer transistors FB1 and FB2.

The drive transistor D1 and the load transistor L1 are connected in series with each other to form a CMOS inverter and the drive transistor D2 and the load transistor L2 are connected in series with each other to form a CMOS inverter. The outputs and the inputs of a pair of the CMOS inverters are cross-coupled to each other to form a flip-flop.

A port-A word line WLA is connected to the gates of the port-A transfer transistors FA1 and FA2 and a port-B word line WLB is connected to the gates of the port-B transfer transistors FB1 and FB2.

A port-A bit line BLA is connected to the gate of the drive transistor D2, the gate of the load transistor L2, the drain of the drive transistor D1, and the drain of the load transistor L1 via the port-A transfer transistor FA1. A port-A bit line BLBA is connected to the drain of the drive transistor D2, the drain of the load transistor L2, the gate of the drive transistor D1, and the gate of the load transistor L1 via the port-A transfer transistor FA2.

A port-B bit line BLB is connected to the gate of the drive transistor D2, the gate of the load transistor L2, the drain of the drive transistor D1, and the drain of the load transistor L1 via the port-B transfer transistor FB1. A port-B bit line BLBB is connected to the drain of the drive transistor D2, the drain of the load transistor L2, the gate of the drive transistor D1, and the gate of the load transistor L1 via the port-B transfer transistor FB2.

When accessing the memory cell MC from the port A, the memory cell MC can be selected by operating the port-A transfer transistors FA1 and FA2 via the port-A word line WLA and the port-A bit lines BLA and BLBA, and when accessing the memory cell MC from the port B, the memory cell MC can be selected by operating the port-B transfer transistors FB1 and FB2 via the port-B word line WLB and the port-B bit lines BLB and BLBB.

In FIG. 1, in the memory cell array 1, the port-A word line WLA that performs row selection of the memory cell MC when accessing from the port A is provided for each row, and the port-B word line WLB that performs row selection of the memory cell MC when accessing from the port B is provided for each row. Moreover, in the memory cell array 1, the port-A bit lines BLA and BLBA that perform column selection of the memory cell MC when accessing from the port A are provided for each column, and the port-B bit lines BLB and BLBB that perform column selection of the memory cell MC when accessing from the port B are provided for each column.

The row decoder 2 can select the port-A word line WLA made to perform row selection of the memory cell MC based on a row address ARAD of the port A and drive the selected port-A word line WLA and can select the port-B word line WLB made to perform row selection of the memory cell MC based on a row address BRAD of the port B and drive the selected port-B word line WLB. The pre-decoder 6 can perform part of the function of the row decoder 2.

When the row addresses ARAD and BRAD are different from each other, the column selector 3 can make data to be exchanged between the port-A bit lines BLA and BLBA and the port A based on a clock ACLK of the port A and make data to be exchanged between the port-B bit lines BLB and BLBB and the port B based on a clock BCLK of the port B. On the other hand, when the row addresses ARAD and BRAD match each other, the column selector 3 can make data to be exchanged between the port-A bit lines BLA and BLBA and the port A based on the clock ACLK and make data to be exchanged between the port-A bit lines BLA and BLBA and the port B based on the clock BCLK. The frequencies of the clocks ACLK and BCLK may be different from each other and are preferably integer multiples of each other. For example, for the frequencies of the clocks ACLK and BCLK to have an integer multiple relationship, the clocks ACLK and BCLK can be generated by dividing or multiplying a reference clock.

The sense amplifier 4A can detect data stored in the memory cell MC based on a signal read out to the port-A bit lines BLA and BLBA from the memory cell MC. The sense amplifier 4B can detect data stored in the memory cell MC based on a signal read out to the port-B bit lines BLB and BLBB from the memory cell MC.

The write amplifier 5A can drive the port-A bit lines BLA and BLBA according to data AI to be written in the memory cell MC. The write amplifier 5B can drive the port-B bit lines BLB and BLBB according to data BI to be written in the memory cell MC.

The clock generating unit 8 can generate a clock XCLK based on the clocks ACLK and BCLK. The clock XCLK can be generated to reflect the rising edges of the clocks ACLK and BCLK. When the rising edges of the clocks ACLK and BCLK are close to each other, the rising edge of one of the clocks ACLK and BCLK may be ignored.

When the row addresses ARAD and BRAD are different from each other, the word line control unit 9 can make the memory cell MC to be accessed from the port A and the port B by controlling a word line potential AWL of the port A and a word line potential BWL of the port B based on the clock XCLK. On the other hand, when the row addresses ARAD and BRAD match each other, the word line control unit 9 can make the memory cell MC to be accessed only from the port A by controlling the word line potential AWL of the port A based on the clock XCLK.

The address comparator 7 can compare the row addresses ARAD and BRAD with each other. The timing control unit 10 can control the timing of operating the sense amplifiers 4A and 4B and the write amplifiers 5A and 5B based on the clocks ACLK and BCLK.

The column decoder 12 can make the port-A bit lines BLA and BLBA, which are made to perform column selection of the memory cell MC based on a column address ACAD of the port A, to be selected and make the port-B bit lines BLB and BLBB, which are made to perform column selection of the memory cell MC based on a column address BCAD of the port B, to be selected.

The column control unit 11 can switch the column selector 3 based on switching signals ACSL, BCSL, and ABCSL.

FIG. 3A to FIG. 3D are block diagrams illustrating a switching method of the column selector in FIG. 1.

Figure 3A:
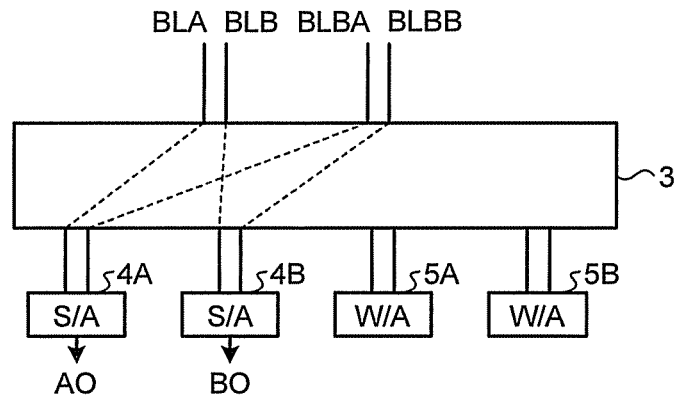
FIG. 3A to FIG. 3D are block diagrams illustrating a switching method of a column selector in FIG. 1.

In FIG. 3A, when the row addresses ARAD and BRAD are different from each other at the time of reading, the column control unit 11 can connect the port-A bit lines BLA and BLBA to the sense amplifier 4A based on the switching signal ACSL synchronized with the clock ACLK and can connect the port-B bit lines BLB and BLBB to the sense amplifier 4B based on the switching signal BCSL synchronized with the clock BCLK.

Figure 3B:
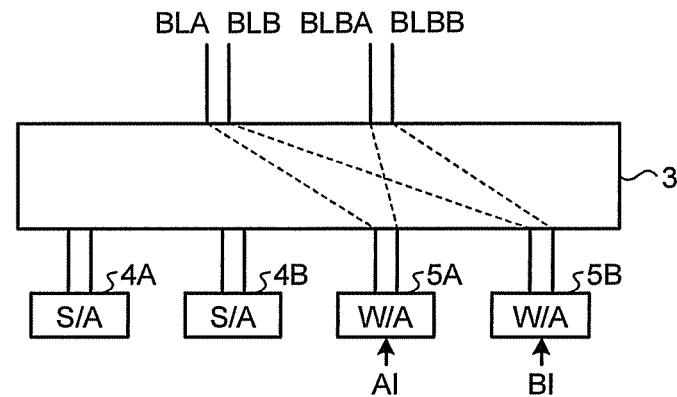

In FIG. 3B, when the row addresses ARAD and BRAD are different from each other at the time of writing, the column control unit 11 can connect the port-A bit lines BLA and BLBA to the write amplifier 5A based on the switching signal ACSL synchronized with the clock ACLK and can connect the port-B bit lines BLB and BLBB to the write amplifier 5B based on the switching signal BCSL synchronized with the clock BCLK.

Figure 3C:
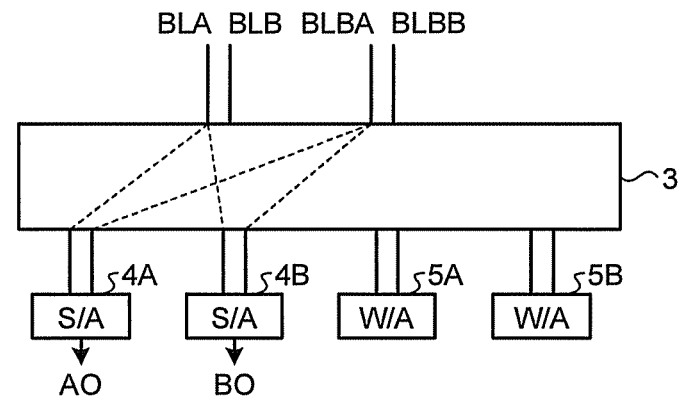

In FIG. 3C, when the row addresses ARAD and BRAD match each other at the time of reading, the column control unit 11 can connect the port-A bit lines BLA and BLBA to the sense amplifier 4A based on the switching signal ACSL synchronized with the clock ACLK and can connect the port-A bit lines BLA and BLBA to the sense amplifier 4B based on the switching signal ABCSL synchronized with the clock BCLK.

Figure 3D:
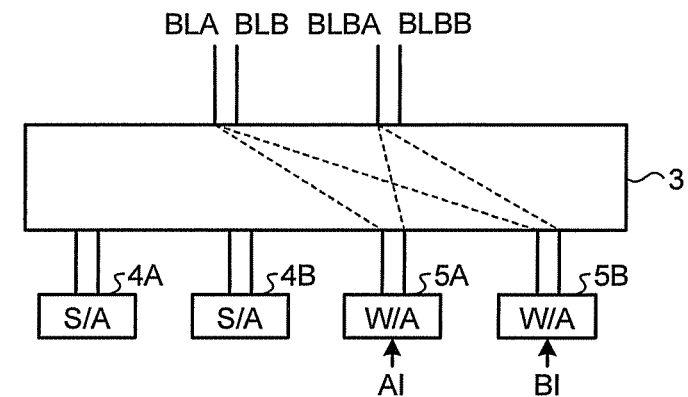

In FIG. 3D, when the row addresses ARAD and BRAD match each other at the time of writing, the column control unit 11 can connect the port-A bit lines BLA and BLBA to the write amplifier 5A based on the switching signal ACSL synchronized with the clock ACLK and can connect the port-A bit lines BLA and BLBA to the write amplifier 5B based on the switching signal ABCSL synchronized with the clock BCLK.

Figure 4:
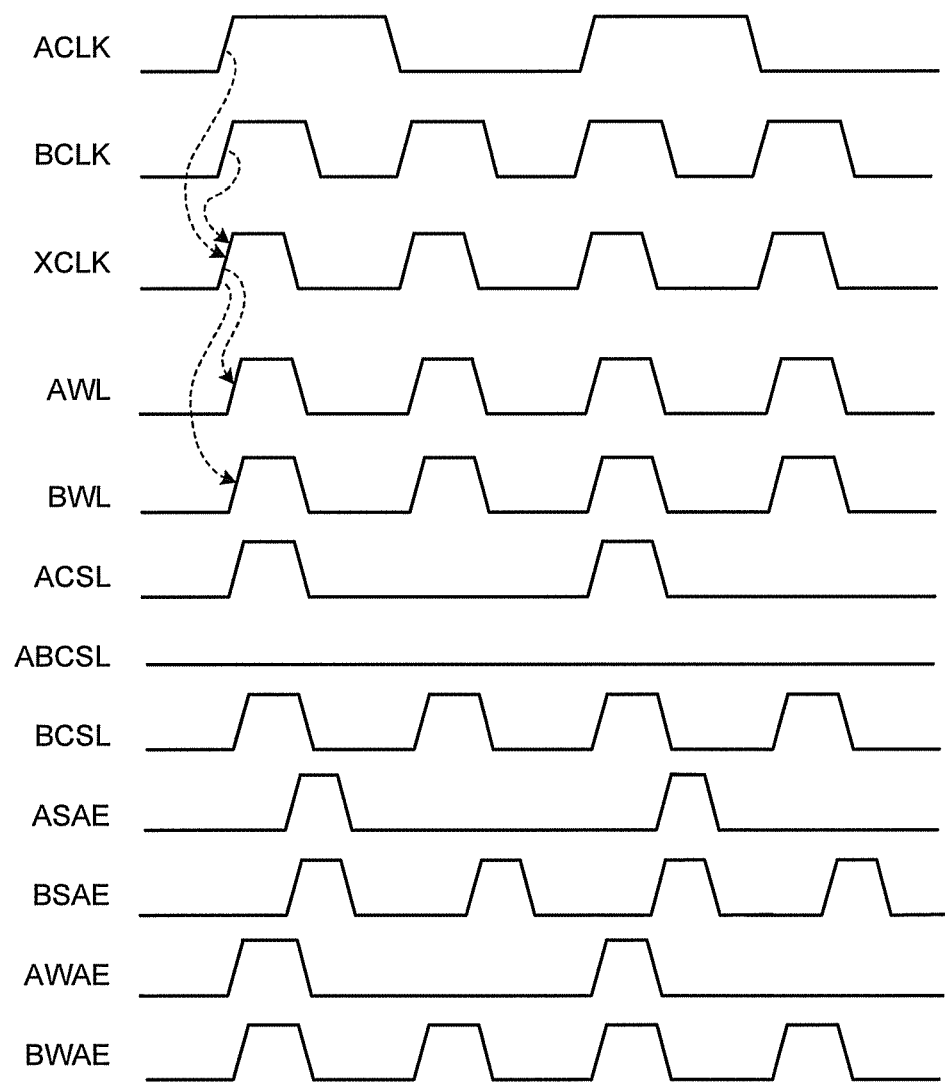
FIG. 4 is a timing chart illustrating a waveform of each unit of the semiconductor storage device in FIG. 1 in the case where row addresses of a port A and a port B are different from each other.

FIG. 4 is a timing chart illustrating a waveform of each unit of the semiconductor storage device in FIG. 1 in the case where the row addresses of the port A and the port B are different from each other.

In FIG. 4, when accessing the memory cell MC from the port A, the clock ACLK is input to the clock generating unit 8, the timing control unit 10, and the column control unit 11. Moreover, the row address ARAD is input to the row decoder 2 via the pre-decoder 6 and the column address ACAD is input to the column decoder 12. Furthermore, the row address ARAD is input also to the address comparator 7.

On the other hand, when accessing the memory cell MC from the port B, the clock BCLK is input to the clock generating unit 8, the timing control unit 10, and the column control unit 11. Moreover, the row address BRAD is input to the row decoder 2 via the pre-decoder 6 and the column address BCAD is input to the column decoder 12. Furthermore, the row address BRAD is input also to the address comparator 7.

Then, in the clock generating unit 8, the clock XCLK is generated based on the clocks ACLK and BCLK and is output to the word line control unit 9. Moreover, in the address comparator 7, the row addresses ARAD and BRAD are compared with each other and the comparison result thereof is output to the word line control unit 9 and the column control unit 11.

Then, in the word line control unit 9, when the row addresses ARAD and BRAD are different from each other, an AWL clock and a BWL clock are generated based on the clock XCLK. Then, the word line potential AWL of the selected row specified by the row address ARAD is raised based on the AWL clock, so that the port-A transfer transistors FA1 and FA2 of the memory cell MC of the selected row in FIG. 2 are turned on. Moreover, the word line potential BWL of the selected row specified by the row address BRAD is raised based on the BWL clock, so that the port-B transfer transistors FB1 and FB2 of the memory cell MC of the selected row in FIG. 2 are turned on.

In the column control unit 11, the switching signals ACSL and BCSL synchronized with the clocks ACLK and BCLK, respectively, are generated and are output to the column selector 3. Then, in the column selector 3, at the time of reading, the port-A bit lines BLA and BLBA of the selected column specified by the column address ACAD are connected to the sense amplifier 4A based on the switching signal ACSL and the port-B bit lines BLB and BLBB of the selected column specified by the column address BCAD are connected to the sense amplifier 4B based on the switching signal BCSL.

Moreover, in the timing control unit 10, at the time of reading, sense amplifier enable signals ASAE and BSAE synchronized with the clocks ACLK and BCLK, respectively, are generated and are output to the sense amplifiers 4A and 4B, respectively.

Then, in the sense amplifier 4A, the signals sent via the port-A bit lines BLA and BLBA are detected, so that data stored in the memory cell MC specified by the row address ARAD and the column address ACAD is detected and is output as read data AO of the port A.

Moreover, in the sense amplifier 4B, the signals sent via the port-B bit lines BLB and BLBB are detected, so that data stored in the memory cell MC specified by the row address BRAD and the column address BCAD is detected and is output as read data BO of the port B.

On the other hand, in the column selector 3, at the time of writing, the port-A bit lines BLA and BLBA of the selected column specified by the column address ACAD are connected to the write amplifier 5A based on the switching signal ACSL and the port-B bit lines BLB and BLBB of the selected column specified by the column address BCAD are connected to the write amplifier 5B based on the switching signal BCSL.

Moreover, in the timing control unit 10, at the time of writing, write amplifier enable signals AWAE and BWAE synchronized with the clocks ACLK and BCLK, respectively, are generated and are output to the write amplifiers 5A and 5B, respectively.

Then, in the write amplifier 5A, the port-A bit lines BLA and BLBA of the selected column are driven according to write data AI, so that the write data AI of the port A is stored in the memory cell MC specified by the row address ARAD and the column address ACAD.

Moreover, in the write amplifier 5B, the port-B bit lines BLB and BLBB of the selected column are driven according to write data BI, so that the write data BI of the port B is stored in the memory cell MC specified by the row address BRAD and the column address BCAD.

Figure 5:
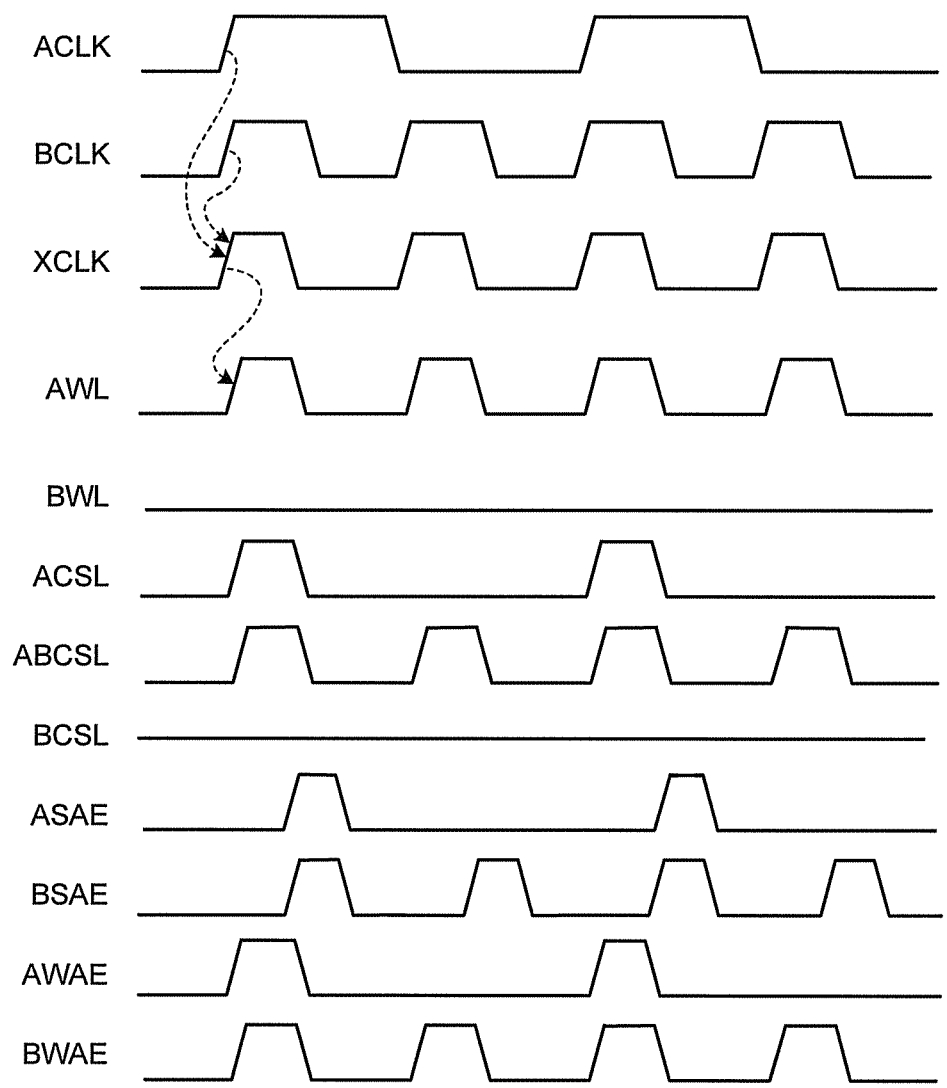
FIG. 5 is a timing chart illustrating a waveform of each unit of the semiconductor storage device in FIG. 1 in the case where row addresses of the port A and the port B match each other.

FIG. 5 is a timing chart illustrating a waveform of each unit of the semiconductor storage device in FIG. 1 in the case where the row addresses of the port A and the port B match each other.

In FIG. 5, in the word line control unit 9, when the row addresses ARAD and BRAD match each other, only the AWL clock is generated based on the clock XCLK. Then, the word line potential AWL of the selected row specified by the row address ARAD is raised based on the AWL clock, so that the port-A transfer transistors FA1 and FA2 of the memory cell MC of the selected row in FIG. 2 are turned on.

Moreover, in the column control unit 11, the switching signals ACSL and ABCSL synchronized with the clocks ACLK and BCLK, respectively, are generated and are output to the column selector 3. Then, in the column selector 3, at the time of reading, the port-A bit lines BLA and BLBA of the selected column specified by the column address ACAD are connected to the sense amplifier 4A based on the switching signal ACSL and the port-A bit lines BLA and BLBA of the selected column specified by the column address ACAD are connected to the sense amplifier 4B based on the switching signal ABCSL.

Moreover, in the timing control unit 10, at the time of reading, the sense amplifier enable signals ASAE and BSAE synchronized with the clocks ACLK and BCLK, respectively, are generated and are output to the sense amplifiers 4A and 4B, respectively.

Then, in the sense amplifier 4A, the signals sent via the port-A bit lines BLA and BLBA are detected, so that data stored in the memory cell MC specified by the row address ARAD and the column address ACAD is detected and is output as the read data AO of the port A.

Moreover, in the sense amplifier 4B, the signals sent via the port-B bit lines BLB and BLBB are detected, so that data stored in the memory cell MC specified by the row address ARAD and the column address BCAD is detected and is output as the read data BO of the port B.

On the other hand, in the column selector 3, at the time of writing, the port-A bit lines BLA and BLBA of the selected column specified by the column address ACAD are connected to the write amplifier 5A based on the switching signal ACSL and the port-A bit lines BLA and BLBA of the selected column specified by the column address ACAD are connected to the write amplifier 5B based on the switching signal ABCSL.

Moreover, in the timing control unit 10, at the time of writing, the write amplifier enable signals AWAE and BWAE synchronized with the clocks ACLK and BCLK, respectively, are generated and are output to the write amplifiers 5A and 5B, respectively.

Then, in the write amplifier 5A, the port-A bit lines BLA and BLBA of the selected column are driven according to the write data AI, so that the write data AI of the port A is stored in the memory cell MC specified by the row address ARAD and the column address ACAD.

Moreover, in the write amplifier 5B, the port-A bit lines BLA and BLBA of the selected column are driven according to the write data BI, so that the write data BI of the port B is stored in the memory cell MC specified by the row address ARAD and the column address BCAD.

Consequently, even when the row addresses ARAD and BRAD of the port A and the port B match each other, the word lines WLA and WLB of the memory cells MC belonging to the row can be prevented from opening in both ports. Therefore, even when it is possible to access the memory cell MC independently from the port A and the port B, decrease in cell current and deterioration of disturb characteristics can be prevented, so that decrease in operation speed and increase in fraction defective can be suppressed.

Figure 6:
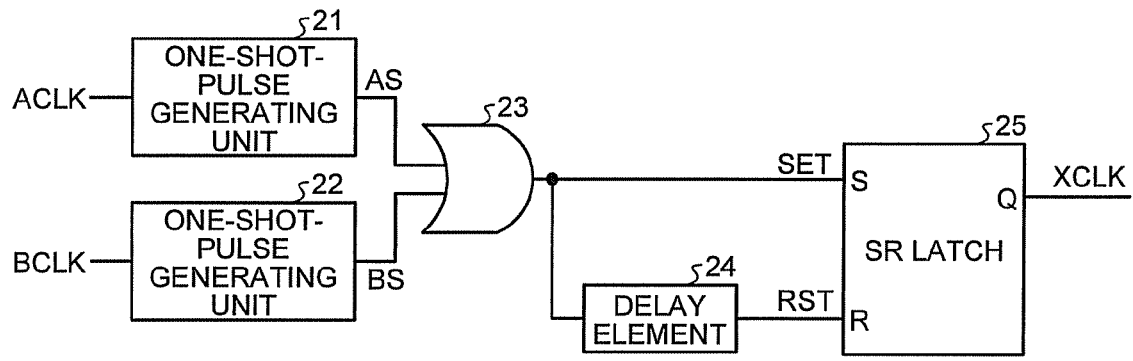
FIG. 6 is a block diagram illustrating a schematic configuration of a clock generating unit in FIG. 1.

FIG. 6 is a block diagram illustrating a schematic configuration of the clock generating unit in FIG. 1.

In FIG. 6, the clock generating unit 8 in FIG. 1 includes one-shot-pulse generating units 21 and 22, an OR circuit 23, a delay element 24, and a latch circuit 25. The output terminal of the one-shot-pulse generating unit 21 is connected to one input terminal of the OR circuit 23 and the output terminal of the one-shot-pulse generating unit 22 is connected to the other input terminal of the OR circuit 23. The output terminal of the OR circuit 23 is connected to a set terminal S of the latch circuit 25 and is connected to a reset terminal R of the latch circuit 25 via the delay element 24.

Figure 7:
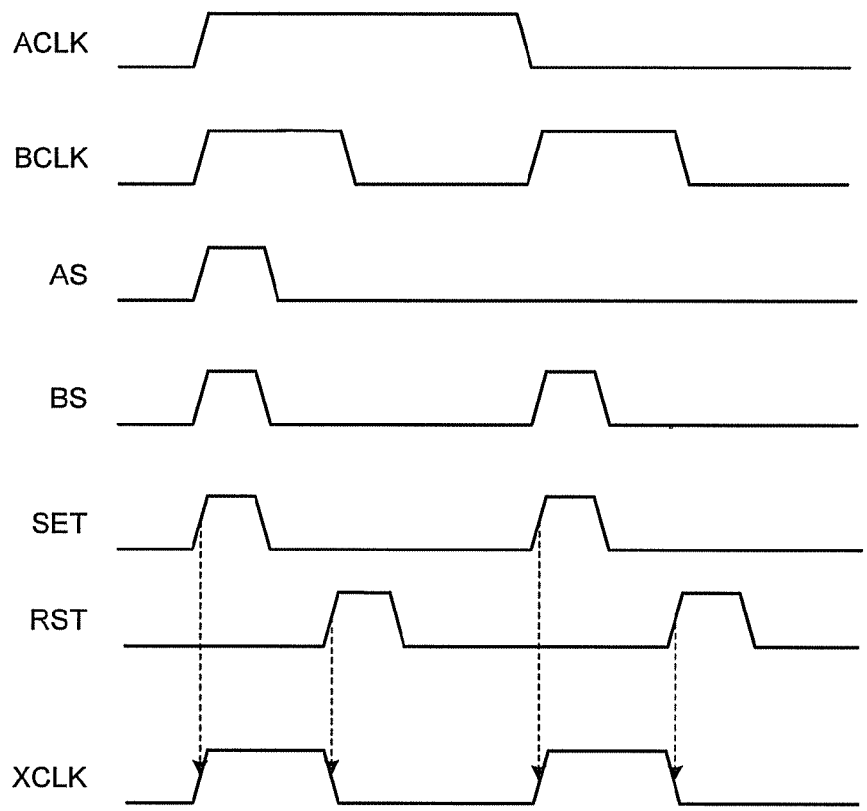
FIG. 7 is a timing chart illustrating a waveform of each unit of the clock generating unit in FIG. 6.

FIG. 7 is a timing chart illustrating a waveform of each unit of the clock generating unit in FIG. 6.

In FIG. 7, in the one-shot-pulse generating unit 21, a pulse signal AS is generated in synchronization with the rising edge of the clock ACLK and is output to one input terminal of the OR circuit 23. In the one-shot-pulse generating unit 22, a pulse signal BS is generated in synchronization with the rising edge of the clock BCLK and is output to the other input terminal of the OR circuit 23. In the OR circuit 23, the pulse signals AS and BS are ORed to generate a set signal SET, which is output to the set terminal S of the latch circuit 25. Moreover, the set signal SET is delayed in the delay element 24 to generate a reset signal RST, which is output to the reset terminal R of the latch circuit 25. Then, an output Q of the latch circuit 25 rises in synchronization with the rising edge of the set signal SET and falls in synchronization with the rising edge of the reset signal RST, whereby the clock XCLK is generated.

Consequently, the clock XCLK reflecting the rising edges of the clocks ACLK and BCLK can be generated, so that it is possible to make the memory cell MC to be accessed with one clock XCLK with respect to any of the port A and the port B.

The pulse width of the clock XCLK can correspond to the delay time of the delay element 24. The delay time of the delay element 24 is preferably set to be shorter than the shorter period between the clocks ACLK and BCLK.

Figure 8:
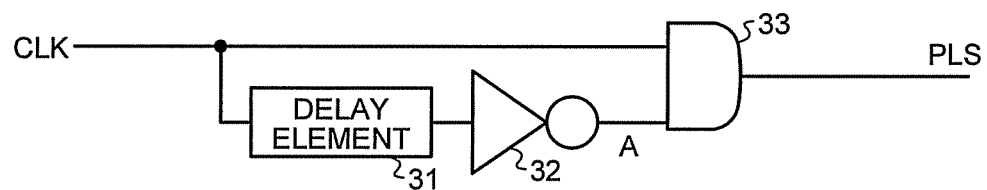
FIG. 8 is a block diagram illustrating a schematic configuration of an one-shot-pulse generating unit in FIG. 6.

FIG. 8 is a block diagram illustrating a schematic configuration of the one-shot-pulse generating unit in FIG. 6.

In FIG. 8, each of the one-shot-pulse generating units 21 and 22 in FIG. 6 includes a delay element 31, an inverter 32, and an AND circuit 33. The clock signal CLK is input to one input terminal of the AND circuit 33 and the clock signal CLK is input to the other input terminal of the AND circuit 33 sequentially via the delay element 31 and the inverter 32.

Figure 9:
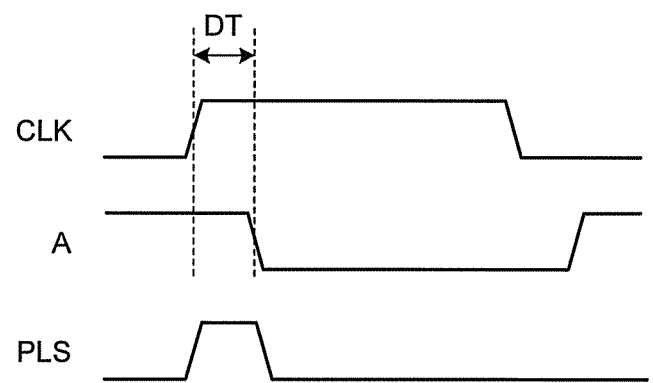
FIG. 9 is a timing chart illustrating a waveform of each unit of the one-shot-pulse generating unit in FIG. 8.

FIG. 9 is a timing chart illustrating a waveform of each unit of the one-shot-pulse generating unit in FIG. 8.

In FIG. 9, after being delayed by a delay time DT in the delay element 31, the clock signal CLK is inverted in the inverter 32 and is input to the other input terminal of the AND circuit 33. Then, in the AND circuit 33, the clock signal CLK and an output A of the inverter 32 are ANDed to generate a pulse signal PLS. The pulse width of the pulse signal PLS can correspond to the delay time DT of the delay element 31.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a memory cell accessible independently from a port A and a port B;
    a clock generating unit that generates a third clock from a first clock of the port A and a second clock of the port B;
    an address comparator that compares a row address of the port A with a row address of the port B;
    a word line control unit that, when the row address of the port A matches the row address of the port B, makes the memory cell to be accessed only from the port A by controlling a word line potential of the port A based on the third clock; and
    a column selector that, when the row address of the port A matches the row address of the port B, makes data to be exchanged between a bit line of the port A and the port A based on the first clock and makes data to be exchanged between the bit line of the port A and the port B based on the second clock.

2. The semiconductor storage device according to claim 1, wherein the word line control unit, when the row address of the port A is different from the row address of the port B, makes the memory cell to be accessed from the port A by controlling a word line potential of the port A based on the third clock and makes the memory cell to be accessed from the port B by controlling a word line potential of the port B based on the third clock.

3. The semiconductor storage device according to claim 1, further comprising:
    a port-A sense amplifier that detects data stored in the memory cell based on a signal read out to the bit line of the port A from the memory cell;
    a port-B sense amplifier that detects data stored in the memory cell based on a signal read out to a bit line of the port B from the memory cell;
    a port-A write amplifier that drives the bit line of the port A according to data to be written in the memory cell; and
    a port-B write amplifier that drives the bit line of the port B according to data to be written in the memory cell.

4. The semiconductor storage device according to claim 3, wherein the column selector, when the row address of the port A matches the row address of the port B at a time of reading, connects the bit line of the port A to the port-A sense amplifier and the port-B sense amplifier.

5. The semiconductor storage device according to claim 3, wherein the column selector, when the row address of the port A matches the row address of the port B at a time of writing, connects the bit line of the port A to the port-A write amplifier and the port-B write amplifier.

6. The semiconductor storage device according to claim 3, wherein the column selector, when the row address of the port A is different from the row address of the port B at a time of reading, connects the bit line of the port A to the port-A sense amplifier and connects the bit line of the port B to the port-B sense amplifier.

7. The semiconductor storage device according to claim 3, wherein the column selector, when the row address of the port A is different from the row address of the port B at a time of writing, connects the bit line of the port A to the port-A write amplifier and connects the bit line of the port B to the port-B write amplifier.

8. The semiconductor storage device according to claim 1, further comprising:
    a first drive transistor;
    a second drive transistor;
    a first load transistor connected in series with the first drive transistor;
    a second load transistor connected in series with the second drive transistor;
    a first port-A transfer transistor to which a drain of the first drive transistor, a drain of the first load transistor, a gate of the second drive transistor, and a gate of the second load transistor are connected;
    a first port-B transfer transistor to which the drain of the first drive transistor, the drain of the first load transistor, the gate of the second drive transistor, and the gate of the second load transistor are connected;

a second port-A transfer transistor whose drain is connected to a gate of the first drive transistor, a gate of the first load transistor, a drain of the second drive transistor, and a drain of the second load transistor; and a second port-B transfer transistor whose drain is connected to the gate of the first drive transistor, the gate of the first load transistor, the drain of the second drive transistor, and the drain of the second load transistor.

9. The semiconductor storage device according to claim 8, further comprising:
a port-A word line connected to gates of the first port-A transfer transistor and the second port-A transfer transistor;
a port-B word line connected to gates of the first port-B transfer transistor and the second port-B transfer transistor;
a first port-A bit line connected to the gate of the second drive transistor, the gate of the second load transistor, the drain of the first drive transistor, and the drain of the first load transistor via the first port-A transfer transistor;
a second port-A bit line connected to the gate of the first drive transistor, the gate of the first load transistor, the drain of the second drive transistor, and the drain of the second load transistor via the second port-A transfer transistor;
a first port-B bit line connected to the gate of the second drive transistor, the gate of the second load transistor, the drain of the first drive transistor, and the drain of the first load transistor via the first port-B transfer transistor; and
a second port-B bit line connected to the gate of the first drive transistor, the gate of the first load transistor, the drain of the second drive transistor, and the drain of the second load transistor via the second port-B transfer transistor.

10. The semiconductor storage device according to claim 9, further comprising a row decoder that drives the port-A word line based on the row address of the port A and drives the port-B word line based on the row address of the port B.

11. The semiconductor storage device according to claim 1, wherein a frequency of the first clock and a frequency of the second clock are integer multiples of each other.

12. The semiconductor storage device according to claim 1, wherein the clock generating unit includes a first one-shot-pulse generating unit that generates a first pulse signal in synchronization with a rising edge of the first clock,
a second one-shot-pulse generating unit that generates a second pulse signal in synchronization with a rising edge of the second clock,
an OR circuit that ORs the first pulse signal and the second pulse signal,
a first delay element that delays an output of the OR circuit, and
a latch circuit that is set by an output of the OR circuit and is reset by an output of the first delay element.

13. The semiconductor storage device according to claim 12, wherein each of the first one-shot-pulse generating unit and the second one-shot-pulse generating unit includes
a second delay element that delays a clock signal,
an inverter that inverts an output of the second delay element, and
an AND circuit that ANDs the clock signal and an output of the inverter.

14. The semiconductor storage device according to claim 3, further comprising a timing control unit that controls timing of causing the port-A sense amplifier, the port-B sense amplifier, the port-A write amplifier, and the port-B write amplifier to operate based on the first clock and the second clock.

15. The semiconductor storage device according to claim 14, further comprising a column control unit that switches the column selector based on a comparison result of the address comparator.

16. The semiconductor storage device according to claim 15, wherein the column control unit, when the row address of the port A and the row address of the port B are different from each other, generates a first switching signal and a second switching signal synchronized with the first clock and the second clock, respectively, and, when the row address of the port A and the row address of the port B match each other, generates the first switching signal and a third switching signal synchronized with the first clock and the second clock, respectively.

17. The semiconductor storage device according to claim 16, wherein
when the row address of the port A and the row address of the port B are different from each other,
the column selector, at a time of reading, connects a port-A bit line of a selected column specified by a column address of the port A to the port-A sense amplifier based on the first switching signal and connects a port-B bit line of a selected column specified by a column address of the port B to the port-B sense amplifier based on the second switching signal, and
the timing control unit, at a time of reading, generates a first sense amplifier enable signal and a second sense amplifier enable signal synchronized with the first clock and the second clock, respectively, and output them to the port-A sense amplifier and the port-B sense amplifier, respectively.

18. The semiconductor storage device according to claim 16, wherein
when the row address of the port A and the row address of the port B are different from each other,
the column selector, at a time of writing, connects a port-A bit line of a selected column specified by a column address of the port A to the port-A write amplifier based on the first switching signal and connects a port-B bit line of a selected column specified by a column address of the port B to the port-B write amplifier based on the second switching signal, and
the timing control unit, at a time of writing, generates a first write amplifier enable signal and a second write amplifier enable signal synchronized with the first clock and the second clock, respectively, and output them to the port-A write amplifier and the port-B write amplifier, respectively.

19. The semiconductor storage device according to claim 16, wherein
when the row address of the port A and the row address of the port B match each other, the column selector, at a time of reading, connects a port-A bit line of a selected column specified by a column address of the port A to the port-A sense amplifier based on the first switching signal and connects a port-A bit line of a selected column specified by a column address of the port A to the port-B sense amplifier based on the third switching signal, and
the timing control unit, at a time of reading, generates a first sense amplifier enable signal and a second sense amplifier enable signal synchronized with the first clock and the second clock, respectively, and output them to the port-A sense amplifier and the port-B sense amplifier, respectively.

20. The semiconductor storage device according to claim 16, wherein
when the row address of the port A and the row address of the port B match each other, the column selector, at a time of writing, connects a port-A bit line of a selected column specified by a column address of the port A to the port-A write amplifier based on the first switching signal and connects a port-A bit line of a selected column specified by a column address of the port A to the port-B write amplifier based on the third switching signal, and
the timing control unit, at a time of writing, generates a first write amplifier enable signal and a second write amplifier enable signal synchronized with the first clock and the second clock, respectively, and output them to the port-A write amplifier and the port-B write amplifier, respectively.

* * * * *